United States Patent
Lee et al.

(10) Patent No.: US 7,564,124 B2
(45) Date of Patent: Jul. 21, 2009

(54) SEMICONDUCTOR DIE PACKAGE INCLUDING STACKED DICE AND HEAT SINK STRUCTURES

(75) Inventors: SangDo Lee, JiangSu (CN); Tiburcio A. Maldo, Suzhou (CN)

(73) Assignee: Fairchild Semiconductor Corporation, South Portland, ME (US)

( * ) Notice: Subject to any disclaimer, the term of this patent is extended or adjusted under 35 U.S.C. 154(b) by 283 days.

(21) Appl. No.: 11/512,941

(22) Filed: Aug. 29, 2006

(65) Prior Publication Data

US 2008/0054417 A1  Mar. 6, 2008

(51) Int. Cl.
*H01L 23/485* (2006.01)
*H01L 23/10* (2006.01)

(52) U.S. Cl. .................. 257/675; 257/706; 257/707; 257/713; 257/720; 257/E23.051; 257/E23.103; 257/E23.105

(58) Field of Classification Search .......... 257/276, 257/625, 675, 706, 707, 712–722, 796, E33.075, 257/E31.131, E23.051, E23.08–E23.113; 438/122, FOR. 413; 174/16.3, 548
See application file for complete search history.

(56) References Cited

U.S. PATENT DOCUMENTS

| | | | |
|---|---|---|---|
| 3,956,821 A | 5/1976 | Martin | |
| 4,058,899 A | 11/1977 | Phy | |
| 4,191,943 A | 3/1980 | Cairns et al. | |
| 4,680,613 A | 7/1987 | Daniels et al. | |
| 4,720,396 A | 1/1988 | Wood | |
| 4,731,701 A | 3/1988 | Kuo et al. | |
| 4,751,199 A | 6/1988 | Phy | |
| 4,772,935 A | 9/1988 | Lowier et al. | |
| 4,791,473 A | 12/1988 | Phy | |
| 4,796,080 A | 1/1989 | Phy | |
| 4,839,717 A | 6/1989 | Phy et al. | |
| 4,890,153 A | 12/1989 | Wu | |
| 5,323,060 A | 6/1994 | Fogal et al. | |
| 5,327,325 A | 7/1994 | Nicewarner, Jr. | |
| 5,646,446 A | 7/1997 | Nicewarner, Jr. et al. | |
| 5,776,797 A | 7/1998 | Nicewarner, Jr. et al. | |
| 6,133,634 A | 10/2000 | Joshi | |
| 6,329,706 B1 | 12/2001 | Nam | |
| 6,424,035 B1 | 7/2002 | Sapp et al. | |
| 6,432,750 B2 | 8/2002 | Jeon et al. | |
| 6,449,174 B1 | 9/2002 | Elbanhawy | |
| 6,455,924 B1* | 9/2002 | Alcoe et al. .................. 257/678 |
| 6,489,678 B1 | 12/2002 | Joshi | |
| 6,556,749 B2 | 4/2003 | Vetsuka et al. | |
| 6,556,750 B2 | 4/2003 | Constantino et al. | |
| 6,559,525 B2 | 5/2003 | Huang | |
| 6,574,107 B2 | 6/2003 | Jeon et al. | |

(Continued)

*Primary Examiner*—Jasmine J Clark
(74) *Attorney, Agent, or Firm*—Townsend and Townsend and Crew LLP

(57) ABSTRACT

A semiconductor package including stacked packages is disclosed. The semiconductor die package includes a first heat sink structure, a first semiconductor die attached to the first heat sink structure and having a first exterior surface, an intermediate conductive element attached to the first semiconductor die, a second semiconductor die attached to the second heat sink structure, and a second heat sink structure attached to the second semiconductor die and comprising a second exterior surface. A molding material is disposed around the first and second semiconductor dice, where the molding material exposes the first exterior surface of the first heat sink structure and exposes the second exterior surface of the second heat sink structure.

28 Claims, 8 Drawing Sheets

U.S. PATENT DOCUMENTS

| | | |
|---|---|---|
| 6,621,152 B2 | 9/2003 | Choi et al. |
| 6,627,991 B1 | 9/2003 | Joshi |
| 6,642,738 B2 | 11/2003 | Elbanhawy |
| 6,645,791 B2 | 11/2003 | Noquil et al. |
| 6,674,157 B2 | 1/2004 | Lang |
| 6,683,375 B2 | 1/2004 | Joshi et al. |
| 6,696,321 B2 | 2/2004 | Joshi |
| 6,720,642 B1 | 4/2004 | Joshi et al. |
| 6,731,003 B2 | 5/2004 | Joshi et al. |
| 6,740,541 B2 | 5/2004 | Rajeev |
| 6,756,689 B2 | 6/2004 | Nam et al. |
| 6,774,465 B2 | 8/2004 | Lee et al. |
| 6,777,786 B2 | 8/2004 | Estacio et al. |
| 6,777,800 B2 | 8/2004 | Madrid et al. |
| 6,806,580 B2 | 10/2004 | Joshi et al. |
| 6,830,959 B2 | 12/2004 | Estacio |
| 6,836,023 B2 | 12/2004 | Joshi et al. |
| 6,867,481 B2 | 3/2005 | Joshi et al. |
| 6,867,489 B1 | 3/2005 | Estacio |
| 6,891,256 B2 | 5/2005 | Joshi et al. |
| 6,891,257 B2 | 5/2005 | Chong et al. |
| 6,893,901 B2 | 5/2005 | Madrid |
| 6,943,434 B2 | 9/2005 | Tangpuz et al. |
| 6,989,588 B2 | 1/2006 | Quinones et al. |
| 6,992,384 B2 | 1/2006 | Joshi |
| 7,009,292 B2 | 3/2006 | Miura et al. |
| 7,022,548 B2 | 4/2006 | Joshi et al. |
| 7,023,077 B2 | 4/2006 | Madrid |
| 7,029,947 B2 | 4/2006 | Joshi |
| 7,061,077 B2 | 6/2006 | Joshi |
| 7,061,080 B2 | 6/2006 | Jeun et al. |
| 7,081,666 B2 | 7/2006 | Joshi et al. |
| 7,122,884 B2 | 10/2006 | Cabahug et al. |
| 7,154,168 B2 | 12/2006 | Joshi et al. |
| 7,157,799 B2 | 1/2007 | Noquil et al. |
| 7,271,477 B2 * | 9/2007 | Saito et al. .................. 257/686 |
| 7,372,146 B2 * | 5/2008 | Sato ........................... 257/706 |
| 2002/0124955 A1 | 9/2002 | Tung et al. |

* cited by examiner

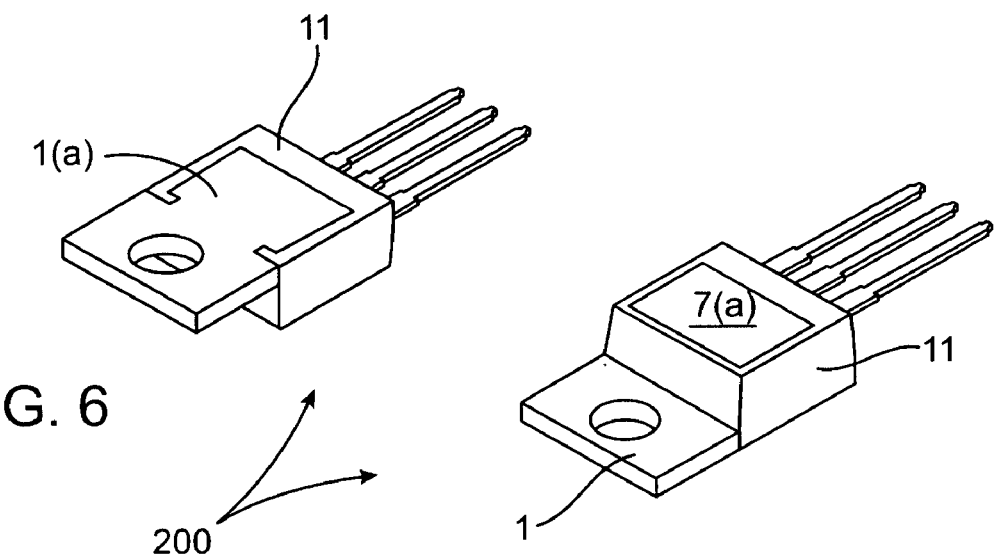
FIG. 6
FIG. 5
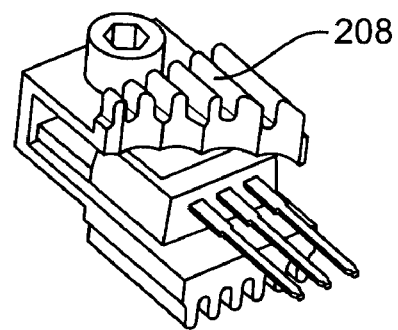
FIG. 7

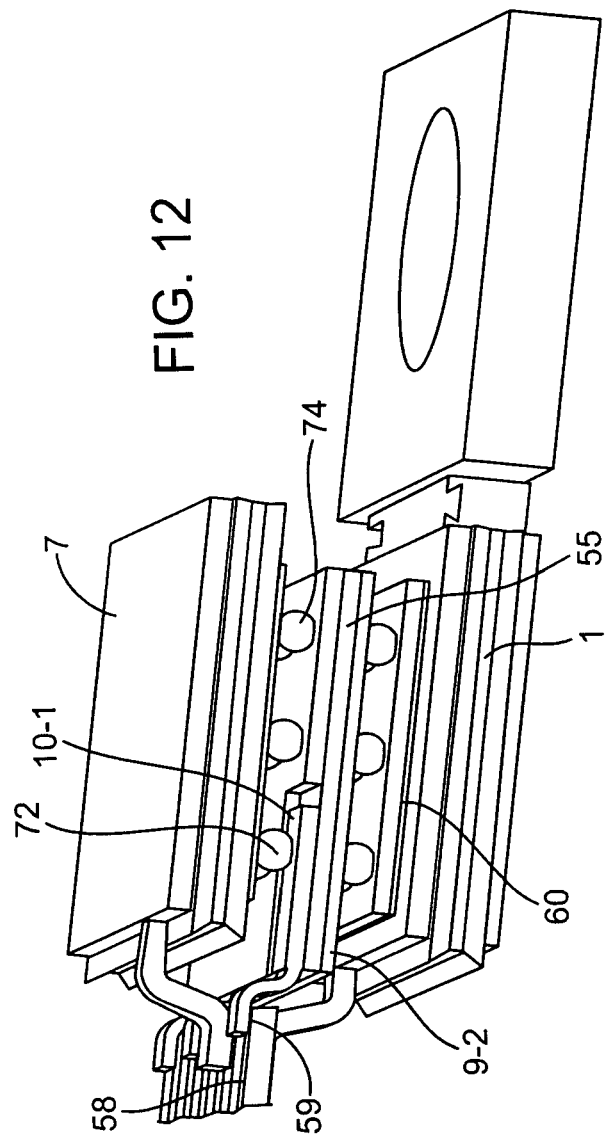
FIG. 12
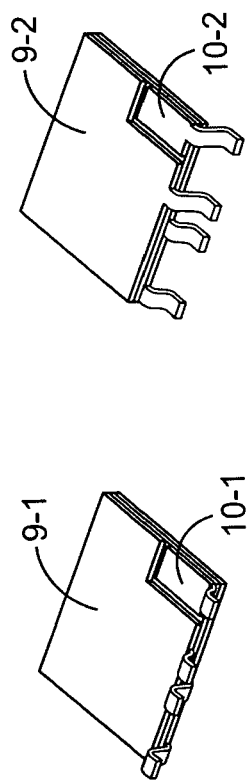
FIG. 13
FIG. 14

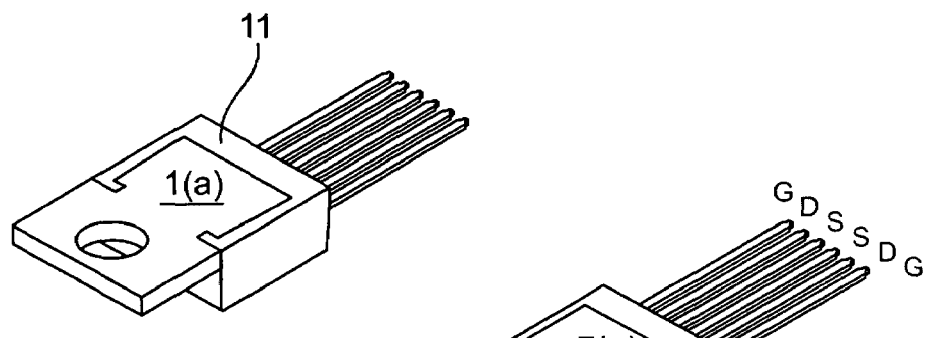
FIG. 16
FIG. 15
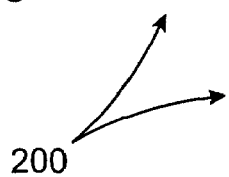
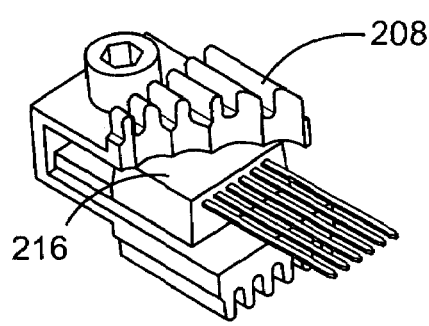
FIG. 17

SEMICONDUCTOR DIE PACKAGE INCLUDING STACKED DICE AND HEAT SINK STRUCTURES

CROSS-REFERENCES TO RELATED APPLICATIONS

Not Applicable

BACKGROUND OF THE INVENTION

A number of power semiconductor die packages exist. In such packages, there is a continuing need to reduce the resistance that is present between input and output terminals (e.g., Rdson or source to drain resistance in a power MOSFET package), and there is a continuing need to improve the heat dissipation properties of such packages. It would be desirable to reduce the resistance and improve the heat dissipation properties of such packages without increasing the space occupied by such packages.

Embodiments of the invention address these and other problems, individually and collectively.

BRIEF SUMMARY OF THE INVENTION

Embodiments of the invention are directed to semiconductor die packages and methods for making semiconductor die packages.

One embodiment of the invention is directed to a semiconductor package comprising: a first heat sink structure; a first semiconductor die attached to the first heat sink structure and having a first exterior surface; an intermediate conductive element attached to the first semiconductor die; a second semiconductor die; a second heat sink structure attached to the second semiconductor die and comprising a second exterior surface; and a molding material disposed around the first and second semiconductor dice, wherein the molding material exposes the first exterior surface of the first heat sink structure and wherein the molding material exposes the second exterior surface of the second heat sink structure.

Another embodiment of the invention is directed to a method for forming a semiconductor die package, the method comprising: (a) attaching a first semiconductor die to a first heat sink structure having a first exterior surface; (b) attaching a second semiconductor die to a second heat sink structure having a second exterior surface; (c) attaching the first semiconductor die to an intermediate conductive element; (d) attaching the second semiconductor die to the intermediate conductive element; and (e) molding a molding material around at least the first and second semiconductor dice, wherein the molded molding material exposes the first exterior surface and the second exterior surface.

These and other embodiments of the invention are described in further detail below.

BRIEF DESCRIPTION OF THE DRAWINGS

FIGS. 5-6 are respectively bottom and top views of semiconductor die packages of the type shown in FIGS. 3-4.

FIG. 7 shows a semiconductor die package assembly including a die package of the type shown in FIGS. 5-6.

FIG. 12 is a side perspective view of a semiconductor die package of the type shown in FIG. 11. However, this solder bumps are shown instead of wire bumps.

FIG. 13 is a top perspective view of an insulated metal substrate.

FIG. 14 is a bottom perspective view of the insulated metal substrate shown in FIG. 13.

FIGS. 15-16 are respectively bottom and top views of semiconductor die packages incorporating the components shown in FIGS. 8-14.

FIG. 17 shows a semiconductor die package assembly including die packages of the type shown in FIGS. 15-16.

DETAILED DESCRIPTION

Figure 2:
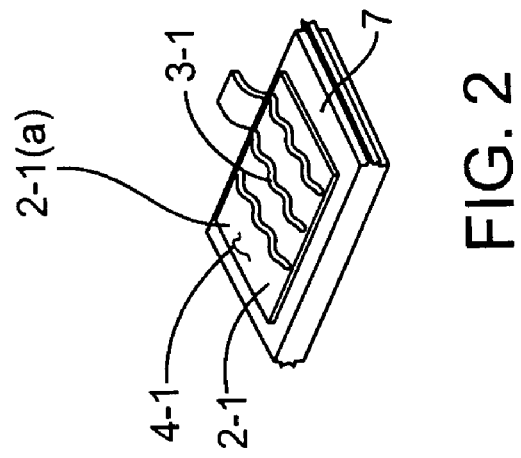
FIG. 2 shows a bottom view of a wire bumped die on an upper heat sink structure.

Embodiments of the invention are directed to semiconductor die packages comprising a first heat sink structure, a first semiconductor die attached to the first heat sink structure and having a first exterior surface, an intermediate conductive element attached to the first semiconductor die, a second semiconductor die attached to the second heat sink structure, a second heat sink structure attached to the second semiconductor die and comprising a second exterior surface, and a molding material disposed around the first and second semiconductor dice. The molding material exposes the first exterior surface of the first heat sink structure and the second exterior surface of the second heat sink structure.

The dice in the semiconductor die packages preferably include vertical semiconductor devices (i.e., there current flows vertically from one major surface of a die to the other major surface of the die) such as power transistors. Vertical power transistors include VDMOS transistors and vertical bipolar power transistors. A VDMOS transistor is a MOSFET (metal oxide semiconductor field effect transistor) that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. Trenched gate structures are preferred, since trenched gate structures are narrower and occupy less space than planar gate structures. During operation, the current flow from the source region to the drain region in a VDMOS device is substantially perpendicular to the die surfaces. In other embodiments, the transistors in the semiconductor dice can be bipolar transistors such as IGBTs (insulated gate bipolar transistors). In such embodiments, one side of the semiconductor die can have an emitter region and a base region. The other side of the die can have a collector region. In yet other embodiments, semiconductor dice may include semiconductor diodes (e.g., Schottky diodes), which have an anode as an input and a cathode as an output.

The dice in the first and second semiconductor dice may also include horizontal devices in some embodiments. For example, a horizontal device such as an LDMOS device may allow current to flow vertically through a die, even though the source and drain are at the same side of the die. In yet other embodiments, a semiconductor die may have inputs and outputs at the same side of the die, without current flowing vertically through the die.

The same or different types of devices may be present in the die packages, in any suitable combination. Any of the above described devices may be combined in a single package if desired. For example, a vertical diode and a vertical MOSFET may be present in the same package.

The molding material that is used in the die packages according to embodiments of the invention may comprise any suitable material and may be molded into any suitable form in the die packages. Suitable molding materials may include thermosetting resins such as epoxy resins.

Other features of embodiments of the invention are described in further detail below with reference to the Figures. In the Figures, like numerals designate like elements.

The Figures below illustrate exemplary TO220 type packages with leads extending from one side of the packages and with two dice per package. Embodiments of the invention are not, however, limited to such packages. For example, embodiments of the invention may include more semiconductor dice (e.g., 3 or more, or 4 or more dice per package, stacked in a similar manner as shown). In addition, the general package configuration may be used for other types of packages including TO251, TO262, TO3P, TO247, TO252 and TO263 type packages. Other types of packages may include SO8 type packages which have leads extending from both sides of the packages. Other types of packages may include MLP (microlead package) type packages.

Figure 1:
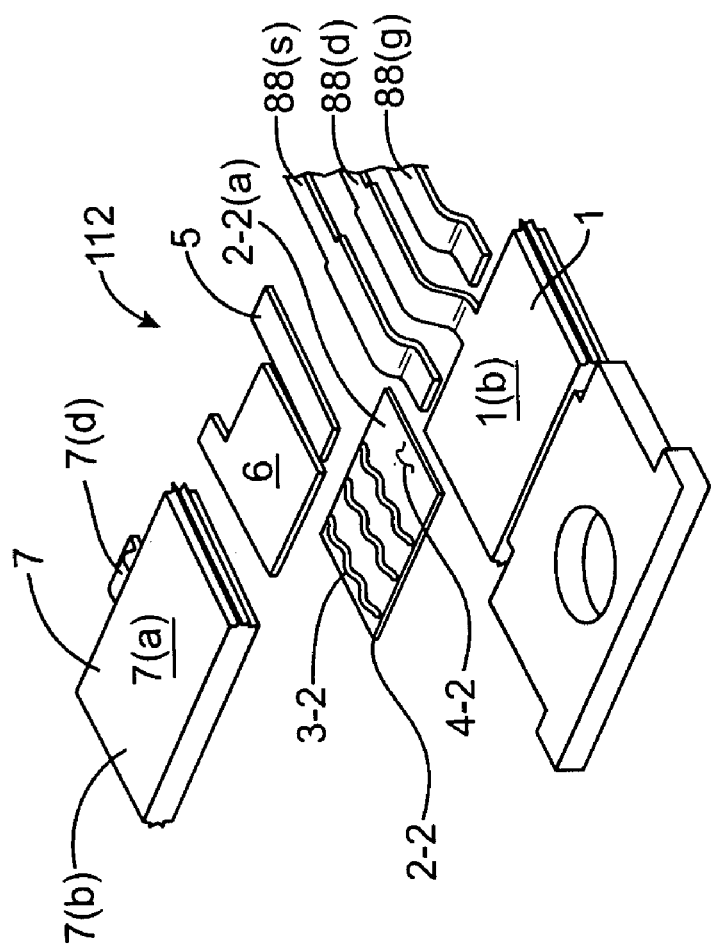
FIG. 1 shows an exploded view of components of a semiconductor die package according to an embodiment of the invention. Wire bumps are shown.

FIG. 1 shows an exploded view of components in a semiconductor die package according to an embodiment of the invention. The exemplary semiconductor die package that will be described includes two power MOSFET dice. As noted above, it is possible for the dice to have other semiconductor devices instead of power MOSFETs. For example, power MOSFET packages may include source leads and source regions, gate leads and gate regions, and drain leads and drain regions. In a semiconductor diode package, the source leads and source regions could alternatively be anode leads or anode regions, while the drain leads and drain regions could alternatively be cathode leads or cathode regions. In another example, in a bipolar junction transistor package, the source leads and regions could alternatively be emitter leads and emitter regions, the drain leads and regions could alternatively be collector leads and regions, and the gate leads and regions could alternatively be base leads and regions.

FIG. 1 shows an intermediate conductive element 112 and a second semiconductor die 2-2 disposed between a first heat sink structure 7 and a second heat sink structure 1. FIG. 2 shows the underside of the first heat sink structure 7 and a first semiconductor die 2-1 is also between the first heat sink structure 7 and the second heat sink structure 1. A molding material (not shown) can be disposed around the first semiconductor die 2-1 and the second semiconductor die 2-2. The molding material can expose a first exterior surface 7(a) of the heat sink structure 7 as well as a second exterior surface of the second heat sink structure 1.

The first heat sink structure 7 may be in any suitable form and may include any suitable material. For example, the first heat sink structure 7 may include a thermally and electrically conductive material such as aluminum, copper, or alloys thereof. As shown in FIG. 1, the first heat sink structure 7 includes a first exterior surface 7(a) as well as a leg 7(d) which extends from a main body 7(b) of the heat sink structure 7. The leg 7(d) can be electrically connected (e.g., using solder) to a drain lead 88(d) that extends from a main body 1(b) of the second heat sink structure 1.

The first and second heat sink structures 7, 1 can dissipate heat from the first and second semiconductor dies 2-1, 2-2, respectively, and can also serve as drain terminals for the MOSFETs therein.

Referring to FIG. 2, the first semiconductor die 2-1 may be attached to the underside of the first heat sink structure 7 using solder, a conductive epoxy, or some other suitable thermally and electrically conductive material. The second semiconductor die 2-2 may be attached to the second heat sink structure 1 in the same way or in a different way.

The first semiconductor die 2-1, can include a first surface 2-1(a), which faces away from the first heat sink structure 7. The second surface (not shown) of the first semiconductor die 2-1 faces toward the first heat sink structure 7 and is mechanically and electrically coupled to it using solder, a conductive epoxy, or the like. The second surface of the semiconductor die 2-1 may include a drain region, and drain current may flow from the semiconductor die 2-1 to the first heat sink structure 7, to the leg 7(d) and to the external drain lead 88(d) which extends from the main body 1(b) of the second heat sink structure 1.

A number of plated wire bumps 3-1, 4-1 may be on the first surface 2-1(a) of the first semiconductor die 2-1. The plated wire bumps 3-1, 4-1 in this example include a gate wire bump 4-1, which is electrically coupled to a gate region at the first surface 2-1(a) of the first semiconductor die 2-1. Gate current may flow to the gate region in the first semiconductor die 2-1 from the gate lead 88(d) via the plated gate wire bump 4-1 and a gate conductive portion 5 (e.g., a gate clip). The plated wire bumps 3-1, 4-1 in this example also include a number of source wire bumps 3-1, which are coupled to one or more source regions at the first surface 2-1(a) of the first semiconductor die 2-1. Source current may flow to the source region(s) in the first semiconductor die 2-1 from the source lead 88(s) via a source conductive portion 6 (e.g., a source clip) and the plated source wire bumps 3-1.

The plated wire bumps 3-1, 4-1 may be formed from any suitable material and may be formed using any suitable process. For example, they may include nicked plated aluminum wires, noble metal coated copper wires, etc. Exemplary processes for forming the plated wire bumps 3-1, 4-1 may include the use of techniques which are described in, for example, U.S. Patent Application No. 60/786,139 entitled "Semiconductor Device with Solderable Loop Contacts", by Lee et al., and filed on Mar. 27, 2006, which is herein incorporated by reference in its entirety for all purposes.

The second semiconductor die 2-2 may also have a number of plated wire bumps 3-2, 4-2 attached to a first surface 2-2(a) of the second semiconductor die 2-2. The plated wire bumps 3-2, 4-2 include source wire bumps 3-2 and a gate wire bump 4-2. The second semiconductor die 2-2, and the corresponding wire bumps 3-2, 4-2 may have the same or different materials, characteristics, or configurations as the first semiconductor die 2-1 and the wire bumps 3-1, 4-1. For example, the first surface 2-2(a) of the second semiconductor die 2-2 may have source regions which are electrically coupled to source wire bumps 3-2 and a gate region electrically coupled to a gate wire bump 4-2.

An intermediate conductive element 112 is disposed between the first and second semiconductor dice 2-1, 2-2. The intermediate conductive element 112 may electrically and/or physically couple the first and second semiconductor dice 2-1, 2-2. In the example shown in FIG. 1, the first and second semiconductor dice 2-1, 2-2 would be both electrically and physically coupled together through the intermediate conductive element 112 which is in the form of a single discontinuous layer of metal. The source conductive portion 6 of the intermediate conductive element 112 may electrically couple the source wire bumps 3-1, 3-2 attached to the source regions of the first and second semiconductor dice 2-1, 2-2, respectively (e.g., using solder). Likewise, the gate wire bumps 4-1, 4-2 attached to the gate regions of the first and second semiconductor dice 2-1, 2-2 may be electrically coupled to the gate conductive portion 5 of the intermediate conductive element 112 (e.g., using solder).

The intermediate conductive element 112 may be in any suitable form. In one embodiment, as shown in FIG. 1, the intermediate conductive element 112 may comprise at least one discontinuous layer. In this example, the discontinuous layer may include a gate conductive portion 5 and a source conductive portion 6. As explained above, the intermediate conductive elements may electrically and mechanically couple source and gate regions in the first and second semiconductor dice 2-1, 2-2 together (e.g., via solder connections). The stacked dice 2-1, 2-2 are electrically coupled in parallel using the intermediate conductive element 112. As will be explained below, in other embodiments of the invention, the intermediate conductive element 112 may mechanically couple, but need not electrically couple the first and second semiconductor dice 2-1, 2-2 together. In such embodiments, the intermediate conductive element 112 may comprise at least one dielectric layer and conductive layers on opposite sides of the insulating layer.

Figure 3:
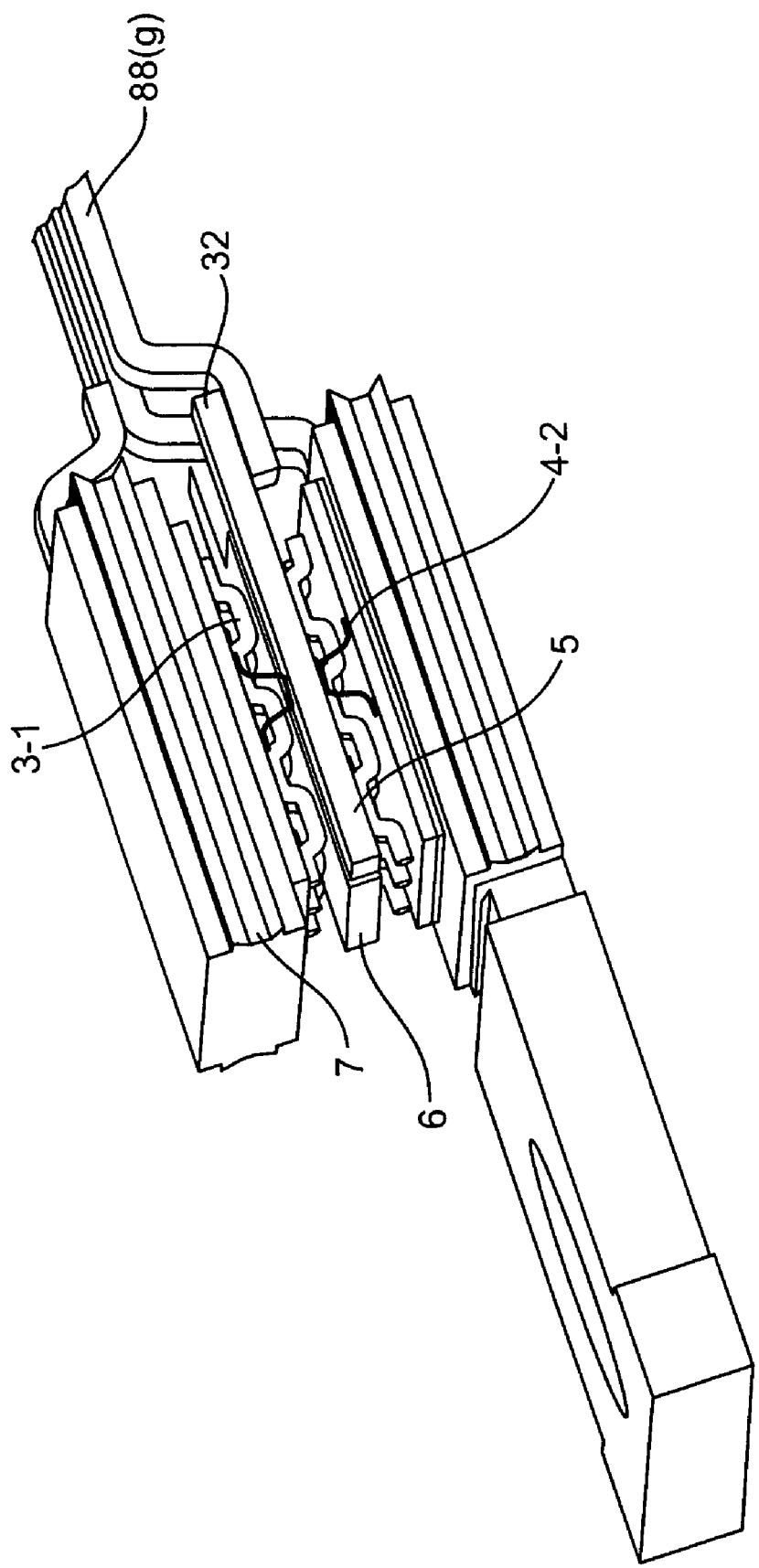
FIG. 3 shows a side, perspective view of the die package shown in FIG. 1 when it is in an assembled state.

FIG. 3 shows the components shown in FIG. 1 when they are assembled together. In FIGS. 1, 2, and 3, like numerals designate like elements. FIG. 3 additionally shows a region 32 where a solder connection would be formed between the gate conductive structure 5 and its corresponding external gate lead 88(g).

Figure 4:
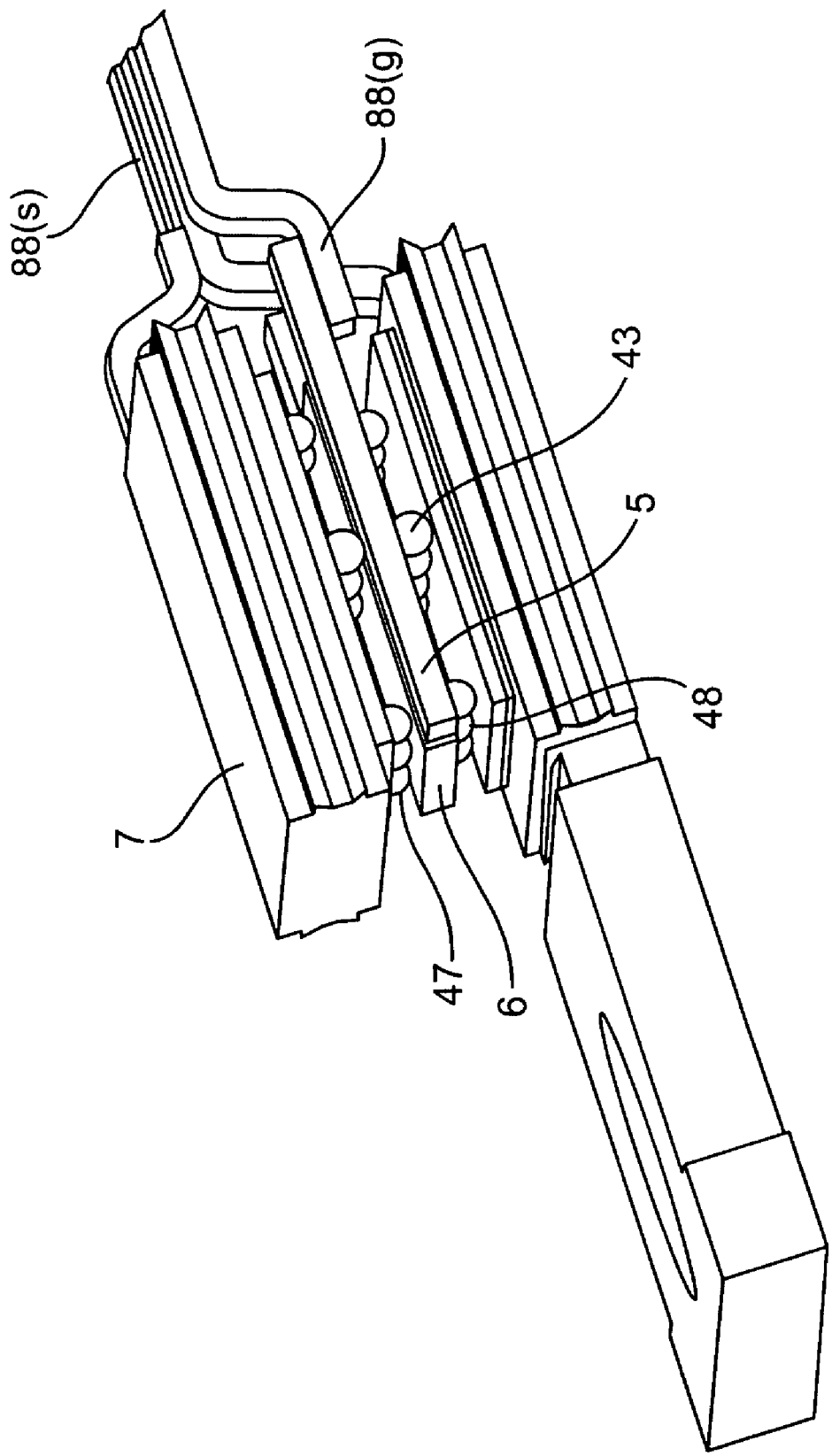
FIG. 4 shows a side, perspective view of another die package embodiment. The die package has a similar construction as the embodiment in FIG. 1. However, solder bumps are used instead of wire bumps.

FIG. 4 shows another package embodiment of the invention. In FIGS. 1, 2, and 4, like numerals designate like elements. However, compared to the embodiment in FIG. 3, in the embodiment in FIG. 4, solder bumps (e.g., solder balls) are used instead of wire bumps. For example, instead of using source wire bumps, source solder bumps 47, 48 can be used to electrically couple source regions in the first and second semiconductor dice to a source conductive structure 6 in the intermediate conductive element. The source solder bumps 47, 48, and any other solder within the formed package may comprise lead (Pb—Sn) or lead-free solder. A gate solder bump 43 is also shown.

Perspective views of formed packages which may include the components in FIGS. 1-4 are shown in FIGS. 5-6. FIG. 5 shows a top perspective view of a semiconductor die package 200. As shown, a first exterior surface 7(a) of a first heat sink structure may be exposed through a molding material 11. The molding material 11 may encapsulate the previously described first and second semiconductor dice. FIG. 6 shows a bottom perspective view of the semiconductor die package 200. As shown, a second exterior surface 1(a) of the second heat sink structure may be exposed by the molding material 11.

In some cases (e.g., in a SO8 type package), the first or second exterior surface 7(a) could be soldered or directly connected to a circuit board to provide for a direct electrical and thermal path to the circuit board (not shown). In this example, the bottom surface of the external leads would be coplanar with the bottom exposed exterior surface of the heat sink structure.

Referring to FIG. 7, if desired, an optional additional finned or unfinned external heat sink 208 may be in thermal contact or thermally coupled to the exposed heat sink structure surfaces 1(a), 7(a) in the package 200. A semiconductor die package assembly may be formed when the package is coupled to the external heat sink 208 or some other additional structure.

Figure 8:
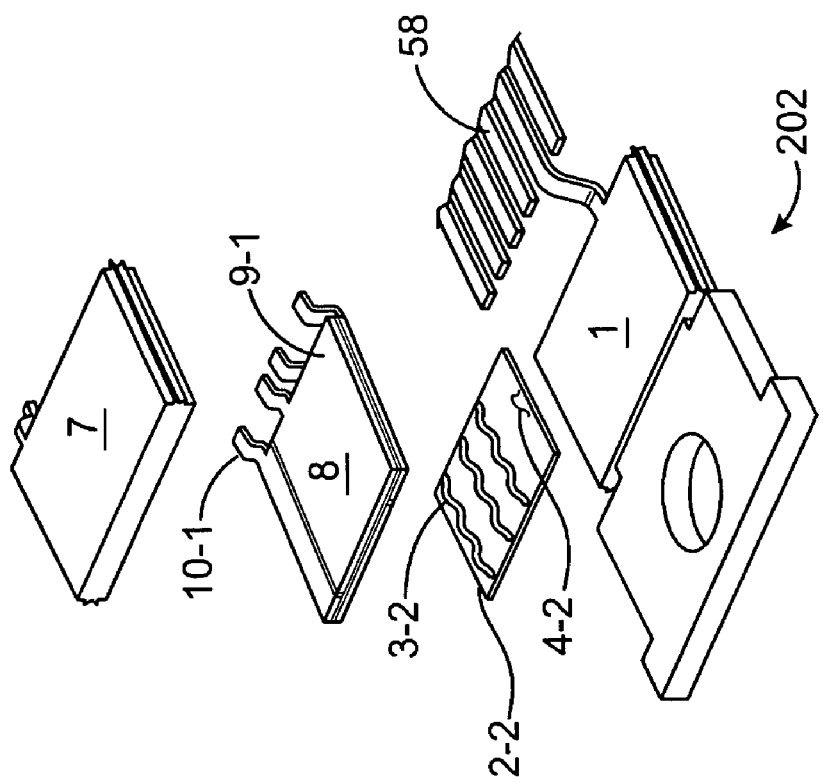
FIG. 8 shows an exploded view of components in another semiconductor die package according to an embodiment of the invention. An intermediate conductive element in the form of a circuit substrate is shown.

FIG. 8 shows another package embodiment of the invention. As in the prior embodiments, in the embodiment shown in FIG. 8, the semiconductor dice may be stacked within the semiconductor die package. However, rather than electrically and mechanically coupling the first and second semiconductor dice within the semiconductor die package, the first and second semiconductor dice are mechanically coupled together, but are not electrically coupled together within the package. In FIGS. 1-8, like numerals designate like elements and the descriptions of like elements need not be repeated.

FIG. 8 shows a first heat sink structure 7 and a second heat sink structure 1. A circuit substrate 8 such as an insulated metal substrate may be disposed between the first and second heat sink structures 7, 1, as well as the first semiconductor die 2-1 (see FIG. 9 which shows the first semiconductor die 2-1 and the underside of the first heat sink structure 7) and the second semiconductor die 2-2.

As shown in FIG. 8, the circuit substrate 8 includes a first discontinuous top conductive layer on one side of an insulating layer. The top conductive layer includes a first source metal layer 9-1 and a first gate metal layer 10-1. As shown, each of these layers 9-1, 10-1 includes at least one leg which can be coupled to one or more of the external leads 58. Since the semiconductor dice 2-1, 2-2 are electrically isolated from each other, they need separate inputs and outputs and the inputs and outputs are not shared as in the previously described embodiments.

As shown, in this example, there are six external leads instead of three external leads as in the previously described semiconductor die packages. The six external leads would corresponding to gate, source, and drain connections for a first semiconductor die in the package and gate, source, and drain connections for a second semiconductor die in the semiconductor die package.

Figure 10:
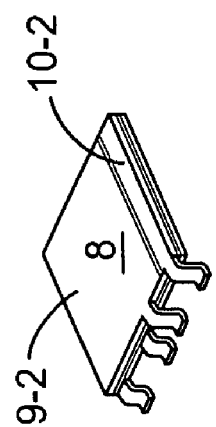
FIG. 10 shows a perspective bottom view of an intermediate conductive element in the package shown in FIG. 8.

FIG. 10 shows the underside of the circuit substrate 8 shown in FIG. 8. As shown therein, the circuit substrate 8 includes a bottom discontinuous conductive layer including a second source metal layer 9-2 and a second gate metal layer 10-2.

Referring to both FIGS. 8 and 10, the first source metal layer 9-1 and the second source metal layer 9-2, and the first gate metal layer 10-1 and the second gate metal layer 10-2 are mechanically coupled together but are electrically isolated from each other within the die package, because an insulating layer is between them. In this example, the circuit substrate 8 includes an insulating layer with discontinuous conductive layers on opposite sides of the insulating layer. In other embodiments, however, there could be more than three distinct layers.

Figure 9:
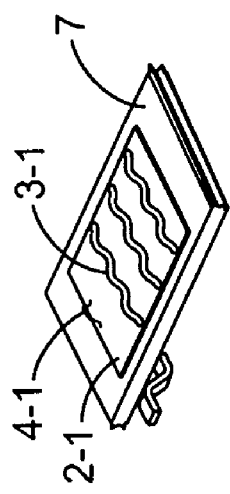
FIG. 9 shows a bottom view of a wire bumped die on an upper heat sink structure.
Figure 11:
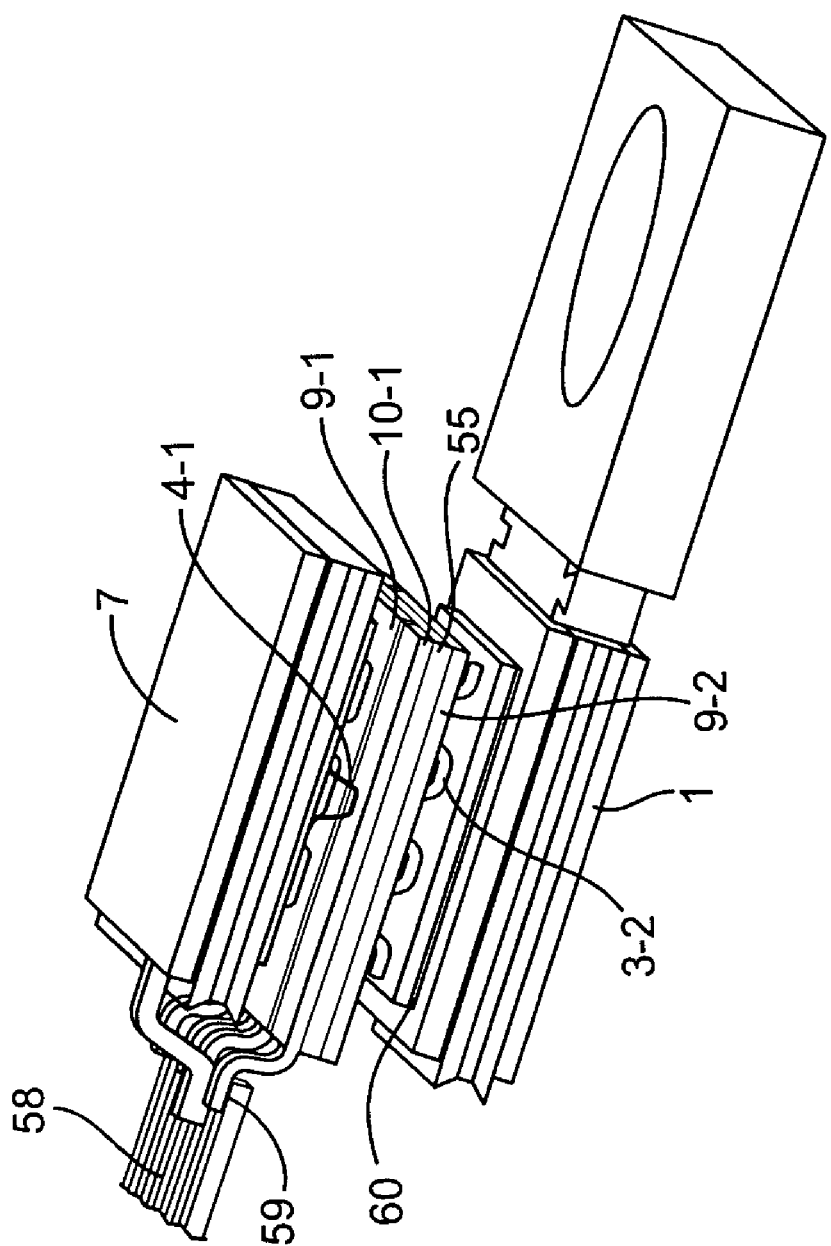
FIG. 11 is a side perspective view of the components shown in FIG. 8 when they are assembled.

FIG. 11 shows a perspective side view of the assembled components that are shown in FIGS. 8-10. Many of the components shown in FIG. 11 are similar to those in FIGS. 1-3. FIG. 11, however, additionally shows a solder interconnection region 59 which can contain solder to join a leg corresponding to first gate layer 10-1 to a corresponding external gate lead in the plurality of external leads 58. Also, a solder die attach 60 is also shown connecting the second semiconductor die to the second heat sink structure 1.

FIG. 11 also shows the insulating layer 55 of the circuit substrate 8 shown in FIGS. 8 and 10. The insulating layer 55 may be made of a ceramic or polymeric material and may electrically isolate the metal layers (e.g., copper layers) on opposite sides of the insulating layer 55 so that the first and second semiconductor dice 2-1 and 2-2 are electrically isolated from each other.

FIG. 12 shows an embodiment like the embodiment in FIG. 11, except that solder bumps are shown instead of wire bumps. FIGS. 13 and 14 respectively show top and bottom perspective views of the circuit substrate 8 shown in FIG. 12. As in the prior embodiment, first and second source metal layers 9-1, 9-2, are separated by an intervening insulting layer 55. First and second gate metal layers 10-1, 10-2 are separated by the same intervening insulating layer 55.

Referring to FIG. 12, a gate solder bump 72 may electrically couple a gate region in the first semiconductor die 2-1 with a first gate metal layer 10-1 in the circuit substrate 8. Source solder bumps 74 may electrically couple a source region in the first semiconductor die with a first source metal layer 9-1 in the circuit substrate 8. Corresponding solder bump connections may be made between the source and gate regions in the second semiconductor die 2-1 and a second source metal layer and a second gate metal layer.

Perspective views of formed packages which may include the components in FIGS. 8-14 are shown in FIGS. 15-16. FIG. 15 shows a top perspective view of a semiconductor die package 202. As shown, a first exterior surface 7(a) of a first heat sink structure may be exposed through a molding material 11. The molding material 11 may encapsulate the previously described first and second semiconductor dice. As shown in FIG. 15, unlike the embodiment shown in FIG. 6, the embodiment in FIG. 15 includes six total leads, with one set of three leads corresponding to the source, gate, and drain in a first MOSFET in a first semiconductor die, and another set of three leads corresponding to the source, gate, and drain in a second MOSFET in a second semiconductor die. FIG. 16 shows a second exterior surface 1(a) of a heat sink structure exposed through a molding material 11.

In some cases (e.g., in a SO8 type package), the first or second exterior surface 7(a) could be soldered or directly connected to a circuit board to provide for a direct electrical and thermal path to the circuit board (not shown). In this example, the bottom surface of the external leads would be coplanar with the bottom exposed exterior surface of the heat sink structure.

Referring to FIG. 17, if desired, an optional additional finned or unfinned heat sink 208 may be in thermal contact or thermally coupled to the exposed heat sink structure surfaces 1(a), 7(a) in the package 200. A semiconductor die package assembly may be formed when the package is coupled to an additional heat sink 208 or some other additional structure. FIG. 17 also shows a piece of electrically insulating Mylar tape 216 being disposed between the exposed surface 7(a) of the first heat sink structure and the additional heat sink 208. The insulating tape 216 (or other layer) can preclude the additional heat sink 208 from forming an electrically conductive path between the exposed surfaces 7(a), 1(a) of the first and second heat sink structures 7, 1.

There are many ways to use the semiconductor die packages and package assemblies that are described above. For example, they may be mounted to circuit boards along with other components in electrical systems such as computer systems, servers, wireless phones, televisions, power supplies, etc. Specifically, they may be used in power conversion circuits in such systems.

Embodiments of the invention may be formed using any suitable process. For example, some embodiments of the invention may be formed by:

(a) attaching a first semiconductor die to a first heat sink structure having a first exterior surface;

(b) attaching a second semiconductor die to a second heat sink structure having a second exterior surface;

(c) attaching the first semiconductor die to an intermediate conductive element;

(d) attaching the second semiconductor die to the intermediate conductive element; and (e) molding a molding material around at least the first and second semiconductor dice, wherein the molded molding material exposes the first exterior surface and the second exterior surface. Other details of exemplary process steps that can be used in embodiments of the invention are provided above and below.

The above-described steps may take place in any suitable order. For example, in an exemplary method for manufacturing packages like those described above, semiconductor power MOSFET dice may be solder and wire bumped. The solder and wire bumping may occur before or after the power MOSFET dice are diced from the wafer (e.g., with a saw) in which they were previously present. High temperature solder or solder plated copper balls could be used for bumping the dice.

Once a solder or wire-bumped die is obtained, the bumped die may then be attached to a bottom second heat sink structure using solder (a mid-melting temperature solder) or the like. Flux dotting could alternatively or additionally be used.

The intermediate conductive element is then obtained. As noted above, the intermediate conductive element may be, for example, a single discontinuous metal layer such as a leadframe or may be multilayer circuit substrate such as a DBC (direct bond copper) substrate. These are commercially obtainable or are readily manufactured by those of ordinary skill in the art.

A screen printing process may then be performed on the intermediate conductive element using a low melting temperature solder. The bumped die may be attached to the intermediate conductive element using a jig, pick and place, etc., and a reflow process may be performed. Then, the other side of the intermediate conductive element may be screen printed with solder paste.

Before or after the above steps are performed, another wire or solder bumped die may then be attached to a top heat sink structure using solder or the like. The top heat sink structure and bumped die may then be attached to the intermediate conductive element on the side opposite the side that contains the previously attached bumped die, thereby forming a stacked die structure.

The resulting structure can be molded using molding dies or a tape assisted molding process. In a tape assisted molding process. One or both of the exterior surfaces of the heat sink structures may be covered with tape and a molding process may be performed. Molding processes are known to those of ordinary skill in the art. After performing the molding process, the tape may be removed to expose the previously covered heat sink structure exterior surfaces. After molding, plating (i.e., lead plating), trim, and test processes may be performed.

Embodiments of the invention have a number of advantages. First, high power products can be achieved by increased die attach areas without changing the footprint or platform of the die package. Second, as illustrated in the embodiments in FIGS. 8-17, dual channel function can be achieved in one package by stacking dies and insulating the dies using a circuit substrate such as a DBC substrate, an IMS (insulated metal substrate) substrate, or other substrate which has an insulating layer between two electrically conductive layers. Also, embodiments of the invention have two heat dissipation paths through the top and bottom of the die package so that heat dissipation is improved. By increasing the heat dissipation path, better heat dissipation is achieved. Lastly, solder or wire bumping is used in the package, thereby improving the Rdson on the package.

Any reference to positional relationships such as "upper", "lower", "above", "below", etc. are intended to refer to the illustrations in the Figures, and may or may not refer to absolute positions in actual embodiments.

Any recitation of "a", "an", and "the" is intended to mean one or more unless specifically indicated to the contrary. Also, as used herein, phrases such as "attached to" and "coupled to" include both direct and indirect connections (e.g., with intervening elements) between two elements.

The terms and expressions which have been employed herein are used as terms of description and not of limitation, and there is no intention in the use of such terms and expressions of excluding equivalents of the features shown and described, it being recognized that various modifications are possible within the scope of the invention claimed.

Moreover, one or more features of one or more embodiments of the invention may be combined with one or more features of other embodiments of the invention without departing from the scope of the invention.

All patents, patent applications, publications, and descriptions mentioned above are herein incorporated by reference in their entirety for all purposes. None is admitted to be prior art.

What is claimed is:

1. A semiconductor package comprising:
   a first heat sink structure;
   a first semiconductor die attached to the first heat sink structure and having a first exterior surface;
   an intermediate conductive element having a first surface attached to the first semiconductor die and a second surface opposite to the first surface;
   a second semiconductor die attached to the second surface of the intermediate conductive element;
   a plurality of conductive wires electrically connecting the first semiconductor die to the first surface of the intermediate conductive element and electrically connecting the second semiconductor die to the second surface of the intermediate conductive element;
   a second heat sink structure attached to the second semiconductor die and comprising a second exterior surface; and
   a molding material disposed around the first semiconductor die and the second semiconductor die, wherein the molding material exposes the first exterior surface of the first heat sink structure and wherein the molding material exposes the second exterior surface of the second heat sink structure.

2. The semiconductor die package of claim 1 wherein the first heat sink structure comprises copper.

3. The semiconductor die package of claim 1 wherein the first semiconductor die and the second semiconductor die comprise vertical devices.

4. The semiconductor die package of claim 1 wherein the first semiconductor die and the second semiconductor die comprise one or more of a vertical MOSFET, IGBT transistor, BJT transistor, and a diode.

5. The semiconductor die package of claim 1 wherein the intermediate conductive element is in the form of a single conductive layer.

6. The semiconductor die package of claim 1 wherein the intermediate conductive element is in the form of a multilayer circuit substrate with at least one insulating layer and at least one conductive layer.

7. The semiconductor die package of claim 1 further comprising a plurality of leads extending from the molding material.

8. A system comprising the semiconductor die package of claim 1.

9. A method for forming a semiconductor die package, the method comprising:
   (a) attaching a first semiconductor die to a first heat sink structure having a first exterior surface;
   (b) attaching a second semiconductor die to a second heat sink structure having a second exterior surface;
   (c) attaching the first semiconductor die to a first surface of an intermediate conductive element such that a plurality of conductive wires electrically connect the first semiconductor die to the first surface of the intermediate conductive element, the intermediate conductive element having a second surface opposite to its first surface;
   (d) attaching the second semiconductor die to second surface of the intermediate conductive element such that a plurality of conductive wires electrically connect the second semiconductor die to the second surface of the intermediate conductive element; and
   (e) molding a molding material around at least the first semiconductor die and the second semiconductor die, wherein the molded molding material exposes the first exterior surface and the second exterior surface.

10. The method of claim 9 wherein the first and second semiconductor dice comprise vertical devices.

11. The method of claim 9 wherein the first and second semiconductor dice comprise vertical MOSFETs.

12. The method of claim 9 wherein the plurality of conductive wires electrically connecting the first and second semiconductor dice to the first intermediate conductive element are electrically coupled to the intermediate conductive element by solder.

13. The method of claim 9 further comprising forming wire bumps on the first semiconductor die before attaching the first semiconductor die to the intermediate conductive element.

14. The method of claim 9 wherein step (c) is performed before step (a).

15. The method of claim 9 wherein steps (a)-(e) are performed in order.

16. The method of claim 9 wherein the intermediate conductive element is in the form of a single conductive layer.

17. The method of claim 9 wherein the intermediate conductive element comprises a circuit substrate including at least one insulating layer and at least one conductive layer.

18. A semiconductor package comprising:
   a first heat sink structure;
   a first semiconductor die attached to the first heat sink structure, the first heat sink structure having a first exterior surface;
   an intermediate conductive element attached to the first semiconductor die, the intermediate conductive element comprising a multilayer circuit substrate with at least one insulating layer and at least one conductive layer;
   a second semiconductor die;
   a second heat sink structure attached to the second semiconductor die and comprising a second exterior surface; and
   a molding material disposed around the first semiconductor die and the second semiconductor die, wherein the molding material exposes the first exterior surface of the first heat sink structure and wherein the molding material exposes the second exterior surface of the second heat sink structure.

19. The semiconductor die package of claim 18 wherein the first semiconductor die and the second semiconductor die comprise one or more of a vertical MOSFET, IGBT transistor, BJT transistor, and a diode.

20. The semiconductor die package of claim 18 further comprising a plurality of leads extending from the molding material.

21. The semiconductor die package of claim 18 wherein the intermediate conductive element has a first surface and a second surface opposite to the first surface, wherein the first semiconductor die is attached to the first surface of the intermediate conductive element, and wherein the second semiconductor die is attached to the second surface of the intermediate conductive element.

22. A semiconductor package comprising:
   a first heat sink structure;
   a first semiconductor die attached to the first heat sink structure and having a first exterior surface;
   an intermediate conductive element attached to the first semiconductor;
   a second semiconductor die;
   a second heat sink structure attached to the second semiconductor die and comprising a second exterior surface; and
   a molding material disposed around the first semiconductor die and the second semiconductor die, wherein the molding material exposes the first exterior surface of the first heat sink structure and wherein the molding material exposes the second exterior surface of the second heat sink structure; and
   a plurality of conductive wires electrically connecting the first semiconductor die to the first intermediate conductive element and electrically connecting the second semiconductor die to the intermediate conductive element.

23. The semiconductor die package of claim 22 wherein the first semiconductor die and the second semiconductor die comprise one or more of a vertical MOSFET, IGBT transistor, BJT transistor, and a diode.

24. A method for forming a semiconductor die package, the method comprising:
   (a) attaching a first semiconductor die to a first heat sink structure having a first exterior surface;
   (b) attaching a second semiconductor die to a second heat sink structure having a second exterior surface;
   (c) attaching the first semiconductor die to an intermediate conductive element, the intermediate conductive element comprising a circuit substrate including at least one insulating layer and at least one conductive layer;
   (d) attaching the second semiconductor die the intermediate conductive element; and
   (e) molding a molding material around at least the first semiconductor die and the second semiconductor die, wherein the molded molding material exposes the first exterior surface and the second exterior surface.

25. The method of claim 24 wherein step (c) is performed before step (a).

26. The method of claim 24 wherein the first and second semiconductor dice comprise vertical devices.

27. The method of claim 24 wherein the first and second semiconductor dice comprise vertical MOSFETs.

28. The method of claim 24 further comprising forming wire bumps on the first semiconductor die before attaching the first semiconductor die to the intermediate conductive element.

* * * * *